US006909131B2

(12) United States Patent
Liu et al.

(10) Patent No.: US 6,909,131 B2
(45) Date of Patent: Jun. 21, 2005

(54) WORD LINE STRAP LAYOUT STRUCTURE

(75) Inventors: Chen-Chin Liu, Hsinchu (TW); Ken-Hui Chen, Taichung (TW); Lan-Ting Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/250,039

(22) Filed: May 30, 2003

(65) Prior Publication Data

US 2004/0238863 A1 Dec. 2, 2004

(51) Int. Cl.[7] ....................... H01L 27/108; H01L 29/76; H01L 29/94; H01L 31/119

(52) U.S. Cl. ....................................... 257/296; 257/395

(58) Field of Search ................................ 257/296, 300, 257/334, 337, 343, 395, E21.423, E29

(56) References Cited

U.S. PATENT DOCUMENTS

| | | | | |
|---|---|---|---|---|
| 6,121,146 A | * | 9/2000 | Yoon et al. | 438/692 |
| 6,563,446 B1 | * | 5/2003 | Sutardja | 341/120 |
| 6,664,171 B2 | * | 12/2003 | Gonzalez et al. | 438/475 |
| 6,680,227 B2 | * | 1/2004 | Kuo et al. | 438/215 |

* cited by examiner

*Primary Examiner*—Phuc T. Dang
(74) *Attorney, Agent, or Firm*—Jianq Chyun IP office

(57) ABSTRACT

A word line strap layout structure is described, comprising an isolation post, a word line, a contact and a metal line. The isolation post is located on a substrate between two memory areas. The word line crosses over the substrate and the isolation post, and the contact is located on the word line over the isolation post, wherein the isolation post and the contact are of the same scale in size. The metal line is located over the substrate electrically connecting with the word line via the contact.

19 Claims, 2 Drawing Sheets

308
306
304
302
300

WORD LINE STRAP LAYOUT STRUCTURE

BACKGROUND OF INVENTION

1. Field of the Invention

The present invention relates to a layout structure in semiconductor devices. More particularly, the present invention relates to a word line strap layout structure used in memory devices.

2. Description of the Related Art

In a high-capacity memory device, the memory array is usually divided into many memory areas that are separated by field oxide (FOX) layers, wherein each memory area may store 8 Mbits, 32 Mbits or 64 Mbits of data. The polysilicon or polycide (polysilicon silicide) word lines of the memory array cross over different memory areas and the field oxide layers between them. To lower the resistance of the word lines, the word lines between the memory areas (or on the field oxide layers) are electrically connected to upper metal lines via contacts to form word line strap structures. Since the resistance of a metallic material is much lower than that of polysilicon or polycide, the RC delay effect of the memory device is substantially reduced with such a design.

FIG. 1A illustrates a top view of a conventional word line strap layout structure, and FIG. 1B illustrates a cross-sectional view of the same along line I–I". FIG. 2 illustrates a drawback of adopting the conventional word line strap layout in a memory device.

Referring to FIGS. 1A–1B, a polysilicon word line 104 crosses over a field oxide layer 102 on a substrate 100 between two memory areas 10, and is electrically connected to a metal line 108 via a contact 106 over the field oxide layer 102 to form a word line strap structure. The field oxide layer 102 usually has a thickness up to 5000–6000Å□ in consideration of high operating voltages, so a large step height is created between the field oxide layer 102 and the adjacent memory areas 10.

Referring to FIG. 2, since both the height and the width of the field oxide layer 102 are large, the critical dimensions of the photoresist patterns 110 for defining bit lines (not shown) near the edges of the memory areas 10 are affected by the field oxide layer 102. Therefore, the critical dimensions of the bit lines near the edges of the memory areas 10 are not within an acceptable range, and the bit lines have to be taken as dummy bit lines. Consequently, the integration of the memory array is reduced.

SUMMARY OF INVENTION

In view of the aforementioned problem, this invention provides a word line strap layout structure that does not affect the critical dimensions of the bit lines near the edges of the memory areas.

This invention also aims to omit the dummy bit lines and increase the integration of the memory array by providing a new word line strap layout structure.

The word line strap layout structure of this invention comprises an isolation post, a word line, a contact and a metal line. The isolation post is located on a substrate between two memory areas, and may include a field oxide (FOX) layer formed with a local oxidation (LOCOS) process. The word line crosses over the substrate and the isolation post, and the contact is located on the word line over the isolation post, wherein the isolation post and the contact are of the same scale in size. The metal line is located over the substrate electrically connecting with the word line via the contact.

Since the size of the isolation post is as small as that of the contact in the word line strap structure of this invention, the critical dimensions of the photoresist patterns for defining bit lines near the edges of the memory areas are little affected by the isolation post. Therefore, the bit lines near the edges of the memory areas can serve as normal bit lines, and the integration of the memory array is increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
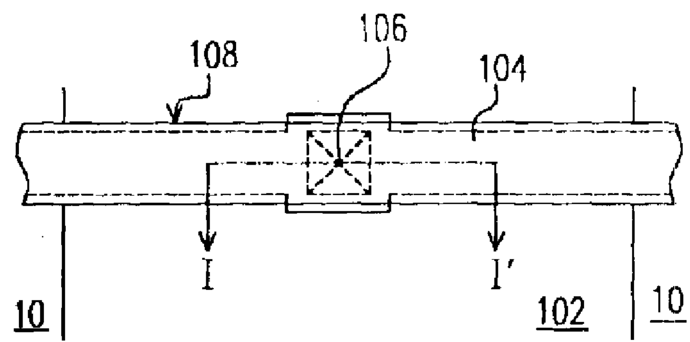
FIG. 1A illustrates a top view of a conventional word line strap layout structure.
Figure 1B:
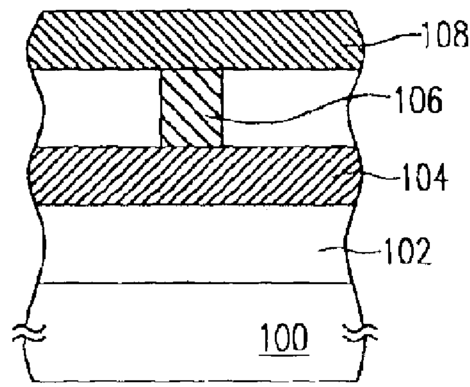
FIG. 1B illustrates a cross-sectional view of the same along line I–I'.
Figure 2:
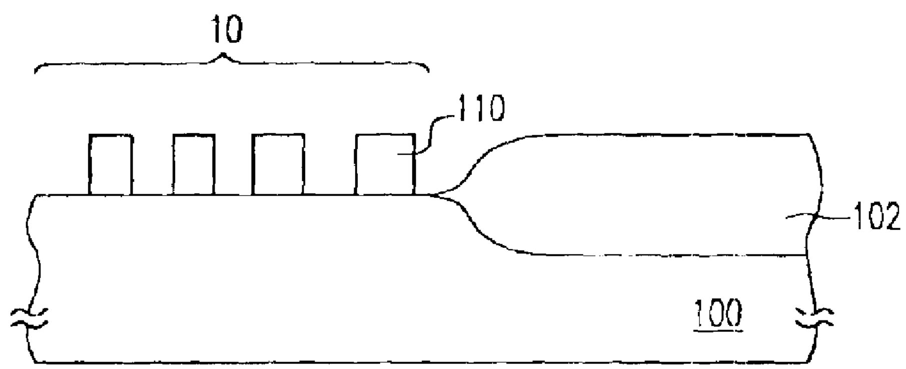
FIG. 2 illustrates a drawback of adopting the conventional word line strap layout in a memory device.
Figure 3:
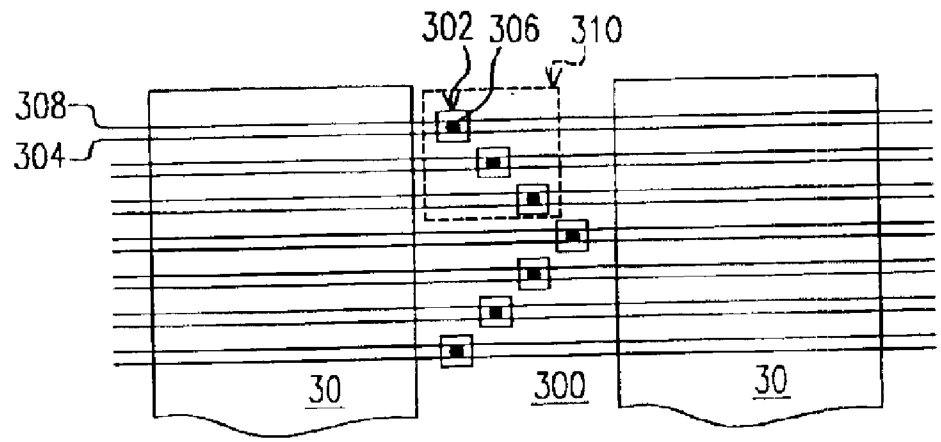
FIG. 3 schematically illustrates a word line strap layout structure according to a preferred embodiment of this invention in a top view.
Figure 4:
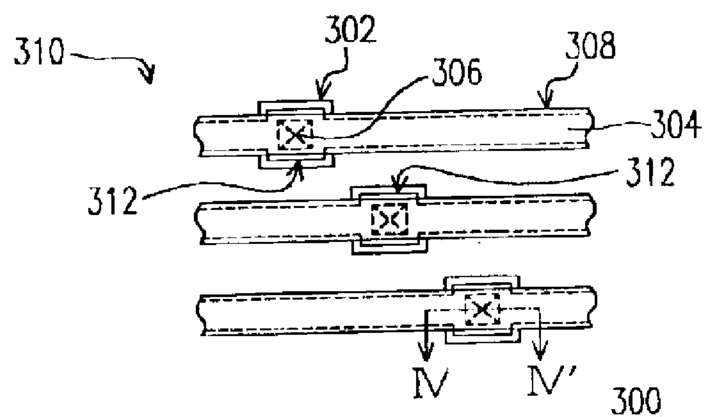
FIG. 4 illustrates a detailed structure of a portion 310 of the word line strap layout structure in FIG. 3.
Figure 5:
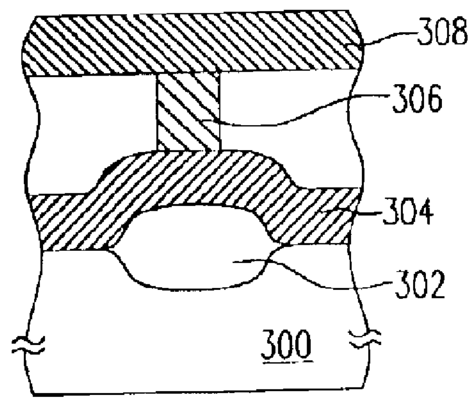
FIG. 5 illustrates a local cross-sectional view of the structure in FIG. 4 along line IV–IV'.

FIGS. 3–5 illustrate a word line strap layout structure according to the preferred embodiment of this invention. FIG. 3 schematically illustrates the word line strap layout structure, FIG. 4 illustrates a detailed structure of a portion 310 of the word line strap layout in FIG. 3, and FIG. 5 illustrates a local cross-sectional view of the structure in FIG. 4 along line IV–IV'.

Referring to FIGS. 3–5, the word line strap layout structure is disposed on a substrate 300 between two memory areas 30, including isolation posts 302, word lines 304, contacts 306 and metal lines 308. The isolation posts 302 are formed on the substrate 300 between the two memory areas 30 (FIG. 3). The memory areas 30 may be flash memory areas or dynamic random access memory (DRAM) areas, and each isolation post 302 can be a field oxide (FOX) layer formed with a local oxidation (LOCOS) process.

The word lines 304 cross over the substrate 300, and may comprise a material such as polysilicon or polycide (polysilicon silicide), wherein each word line 304 crosses over at least one isolation post 302. The contact 306 are disposed on the word lines 304, and may comprise a conductive material like metal, wherein each contact 306 is located on a word line 304 and over an isolation post 302. The metal lines 308 are located over the substrate 300, and may comprise a metallic material like aluminum or copper, wherein each metal line 308 is electrically connected with a word line 304 via at least one contact 306. Since the resistance of a metallic material is much lower than that of polysilicon or polycide, the RC delay effect of the memory device can be substantially reduced.

Moreover, as shown in FIGS. 3–4, two isolation posts 302 under two adjacent word lines 304 are not aligned with each other. That is, two contacts 306 above two adjacent word lines 304 and the two broadened portions 312 of the two adjacent word lines 304 around the contacts 306 are not aligned with each other. Therefore, the pitch of the word lines 304 can be decreased to increase the integration of the memory device. Besides, the arrangement of the isolation posts 302 is not restricted to the zigzag form as illustrated in FIG. 3, and can be of any form if only two isolation posts 302 under two adjacent word lines 304 are not aligned with each other. In addition, there can be two or more pairs of contact and isolation post disposed with a word line between two memory areas for reducing the resistance between the word line and the corresponding metal line.

Since the size of the isolation post is as small as that of the contact in the word line strap structure of this invention, the critical dimensions of the photoresist patterns for defining bit lines near the edges of the memory areas are little affected by the isolation post. Therefore, the bit lines near the edges of the memory areas can serve as normal bit lines, and the integration of the memory array is increased.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A word line strap layout structure, comprising:

an elevated isolation region on a substrate between two memory areas;

a word line crossing over the substrate and the elevated isolation region;

a contact on the word line over the elevated isolation region; and a metal line over the substrate electrically connecting with the word line via the contact.

2. The word line strap layout structure of claim 1, wherein the isolation comprises a field oxide (FOX) layer.

3. The word line strap layout structure of claim 1, wherein the memory areas comprise flash memory areas.

4. The word line strap layout structure of claim 1, wherein the memory areas comprise dynamic random access memory (DRAM) areas.

5. The word line strap layout structure of claim 1, wherein the word line comprises a material that contains polysilicon or polycide.

6. The word line strap layout structure of claim 1, wherein the contact comprises a metal material.

7. The word line strap layout structure of claim 1, wherein the metal line comprises aluminum or copper.

8. A word line strap layout structure, comprising:

a plurality of isolation posts on a substrate between two memory areas;

a plurality of word lines crossing over the substrate, wherein each word line crosses over at least one isolation post, and two isolation posts under two adjacent word lines are not aligned with each other;

a plurality of contacts on the word lines, wherein each contact is located on a word line and over an isolation post; and a plurality of metal lines over the substrate, wherein each metal line is electrically connected with a word line via at least one contact.

9. The word line strap layout structure of claim 1, wherein the elevated isolation region in combination with other elevated isolation regions are arranged in a zigzag form.

10. The word line strap layout structure of claim 8, wherein the isolation posts comprise field oxide (FOX) layers.

11. The word line strap layout structure of claim 8, wherein the memory areas comprise flash memory areas.

12. The word line strap layout structure of claim 8, wherein the memory areas comprise dynamic random access memory (DRAM) areas.

13. The word line strap layout structure of claim 8, wherein the word lines comprise polysilicon or polycide.

14. The word line strap layout structure of claim 8, wherein the contacts comprise a metal material.

15. The word line strap layout structure of claim 8, wherein the metal lines comprise aluminum or copper.

16. A word line strap layout structure, comprising:

an elevated isolation region on a substrate between two memory areas;

a word line crossing over the substrate and the elevated isolation region;

a contact on the word line over the elevated isolation region, wherein the word line and the contact are substantially of the same scale in size; and a metal line over the substrate electrically connecting with the word line via the contact.

17. The word line strap layout structure of claim 16, wherein the isolation comprises a field oxide (FOX) layer.

18. The word line strap layout structure of claim 1, wherein the word line comprises a material that contains polysilicon or polycide.

19. The word line strap layout structure of claim 1, wherein the contact comprises a metal material.

* * * * *